(12) United States Patent
Yamada

(10) Patent No.: US 11,437,776 B2
(45) Date of Patent: Sep. 6, 2022

(54) LIGHT EMISSION CONTROL DEVICE, LIGHT SOURCE DEVICE, AND PROJECTION-TYPE VIDEO DISPLAY APPARATUS

(71) Applicant: SEIKO EPSON CORPORATION, Tokyo (JP)

(72) Inventor: Atsushi Yamada, Nagoya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 381 days.

(21) Appl. No.: 16/801,352

(22) Filed: Feb. 26, 2020

(65) Prior Publication Data
US 2020/0274322 A1 Aug. 27, 2020

(30) Foreign Application Priority Data
Feb. 27, 2019 (JP) .............................. JP2019-033689

(51) Int. Cl.
*H01S 5/042* (2006.01)
*H05B 45/10* (2020.01)
*H05B 45/325* (2020.01)

(52) U.S. Cl.
CPC ............ *H01S 5/0428* (2013.01); *H05B 45/10* (2020.01); *H05B 45/325* (2020.01)

(58) Field of Classification Search
CPC ........ H05B 45/00; H05B 45/10; H05B 45/20; H05B 45/30; H05B 45/32; H05B 45/325; H05B 45/327; H05B 47/00; H05B 47/10; H05B 47/20; G03B 21/2053; G03B 21/2033; G03B 21/2013; H01S 5/0428; H01S 5/0427; H01S 5/0425; H01S 5/4018
See application file for complete search history.

(56) References Cited

U.S. PATENT DOCUMENTS

| | | |
|---|---|---|
| 2004/0124889 A1 | 7/2004 | Koharagi et al. |
| 2013/0250215 A1* | 9/2013 | Sasaki .................... H05B 45/46 349/69 |
| 2018/0180978 A1* | 6/2018 | Yamada ............... H05B 45/375 |
| 2019/0110349 A1* | 4/2019 | Tsukahara .......... G03B 21/2033 |
| 2019/0239300 A1* | 8/2019 | Yamada ............. G03B 21/2033 |
| 2020/0264501 A1* | 8/2020 | Ishimaru ............... H01S 5/0428 |

FOREIGN PATENT DOCUMENTS

| | | |
|---|---|---|
| JP | 2004-147435 A | 5/2004 |
| JP | 2012-043657 A | 3/2012 |

* cited by examiner

*Primary Examiner* — Alexander H Taningco
*Assistant Examiner* — Amy X Yang
(74) *Attorney, Agent, or Firm* — Rankin, Hill & Clark LLP

(57) ABSTRACT

A light emission control device includes: a first light emission control circuit outputting a first control signal and a second control signal; and a second light emission control circuit outputting a third control signal and a fourth control signal. The first light emission control circuit controls a phase of the second control signal based on a first PWM signal in a first PWM dimming mode. The second light emission control circuit controls a phase of the fourth control signal based on a second PWM signal in a second PWM dimming mode. The second light emission control circuit outputs the fourth control signal having a phase different from that of the second control signal in a first analog dimming mode and a second analog dimming mode.

10 Claims, 15 Drawing Sheets

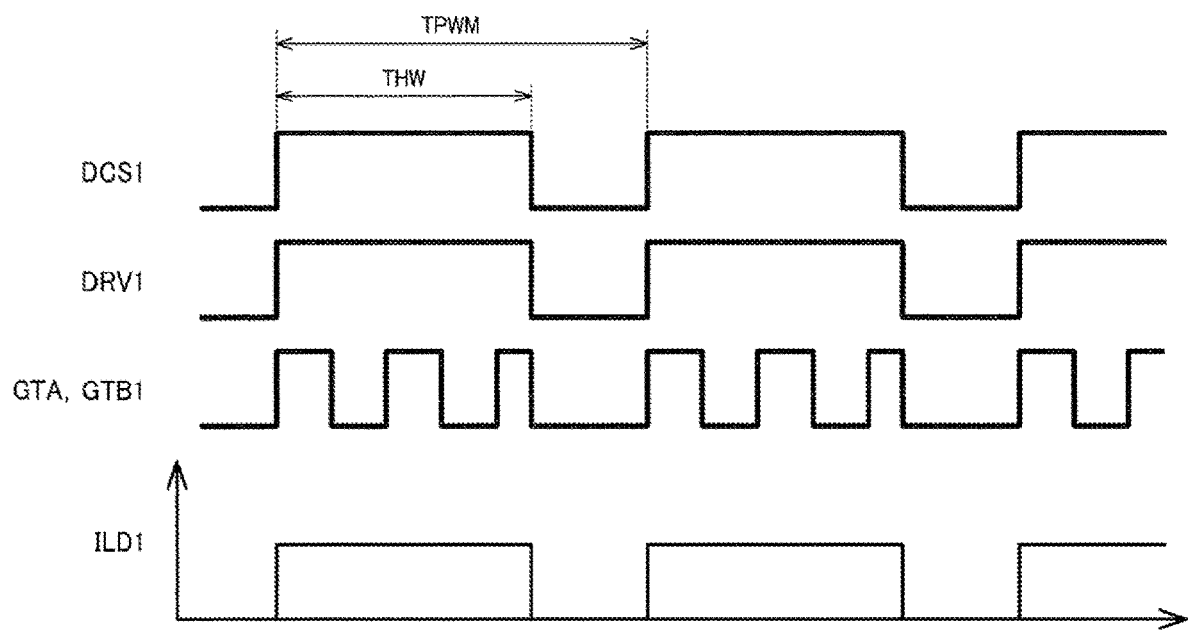

FIG. 10

| AMOD1 | L | | H | |
|---|---|---|---|---|
| AMOD2 | L | H | L | H |
| ENB | DCS2 | | | AENB |

LIGHT EMISSION CONTROL DEVICE, LIGHT SOURCE DEVICE, AND PROJECTION-TYPE VIDEO DISPLAY APPARATUS

The present application is based on, and claims priority from JP Application Serial Number 2019-033689, filed Feb. 27, 2019, the disclosure of which is hereby incorporated by reference herein in its entirety.

BACKGROUND

1. Technical Field

The present disclosure relates to a light emission control device, a light source device, a projection-type video display apparatus, and the like.

2. Related Art

For example, a light emission control device that controls alight source used in a projector or the like is known. The light emission control device dims a light emission amount of a light emission element based on a PWM signal and a dimming control voltage supplied from an external processing device. A dimming mode includes an analog dimming mode in which the light emission amount is dimmed by a voltage value of a dimming control voltage, and a PWM dimming mode in which the light emission amount is dimmed by a pulse width of a PWM signal. Dimming is performed in the analog dimming mode from a maximum luminance to a predetermined luminance, and dimming is performed in the PWM dimming mode below the predetermined luminance. The related art of such a light emission control device is disclosed, for example, in JP-A-2012-043657.

The light emission control device in JP-A-2012-043657 includes a plurality of light emission control circuits, and each light emission control circuit outputs a control signal to a switching element for switching and regulating a current flowing through an inductor. The light emission element emits light when the current of the inductor flows through the light emission element. In JP-A-2012-043657, the plurality of light emission control circuits are shifted in switching phase from each other. In JP-A-2012-043657, in the PWM dimming mode, the current flowing through the light emission element is PWM-controlled by stopping the switching of the switching element when the PWM signal is inactive.

In the PWM dimming mode in JP-A-2012-043657, switching of the switching element is restarted when the PWM signal changes from inactive to active. In this case, since a phase relationship between the PWM signal and the switching is arbitrary, there is a possibility that a first on period after the switching is restarted is shortened. When the on period of the switching element is shortened, sufficient energy is not accumulated in the inductor in the on period, so that there is a problem that a sufficient current may not flow through the light emission element.

SUMMARY

An aspect of the present disclosure relates to a light emission control device for controlling a first switching element provided in series with a first light emission element between a first power source node and one end of a first inductor, a second switching element provided between the other end of the first inductor and a second power source node, a third switching element provided in series with a second light emission element between the first power source node and one end of a second inductor, and a fourth switching element provided between the other end of the second inductor and the second power source node, the device including: a first light emission control circuit outputting a first control signal for controlling turning on/off of the first switching element based on a first PWM signal and a second control signal for controlling turning on/off of the second switching element in a period in which the first PWM signal is active; and a second light emission control circuit outputting a third control signal for controlling turning on/off of the third switching element based on a second PWM signal and a fourth control signal for controlling turning on/off of the fourth switching element in a period in which the second PWM signal is active. In a first PWM dimming mode in which a light emission amount of the first light emission element is set by an on-duty of the first PWM signal, the first light emission control circuit controls a phase of the second control signal based on the first PWM signal. In a second PWM dimming mode in which a light emission amount of the second light emission element is set by an on-duty of the second PWM signal, the second light emission control circuit controls a phase of the fourth control signal based on the second PWM signal. In a first analog dimming mode in which the first PWM signal is fixed to be active, and a second analog dimming mode in which the second PWM signal is fixed to be active, the second light emission control circuit outputs the fourth control signal having a phase different from that of the second control signal.

BRIEF DESCRIPTION OF THE DRAWINGS

FIG. 4 is a waveform diagram in a PWM dimming mode.

FIG. 5 is a diagram for explaining the operation of a selector according to a dimming mode.

FIG. 10 is a diagram for explaining an operation of a selector according to a dimming mode.

DESCRIPTION OF EXEMPLARY EMBODIMENTS

Hereinafter, preferred embodiments of the present disclosure will be described in detail. In addition, the embodiments described below do not unduly limit the contents described in the appended claims, and all the configurations described in the embodiments are not necessarily essential constituent elements.

1. Light Source Device

Figure 1:
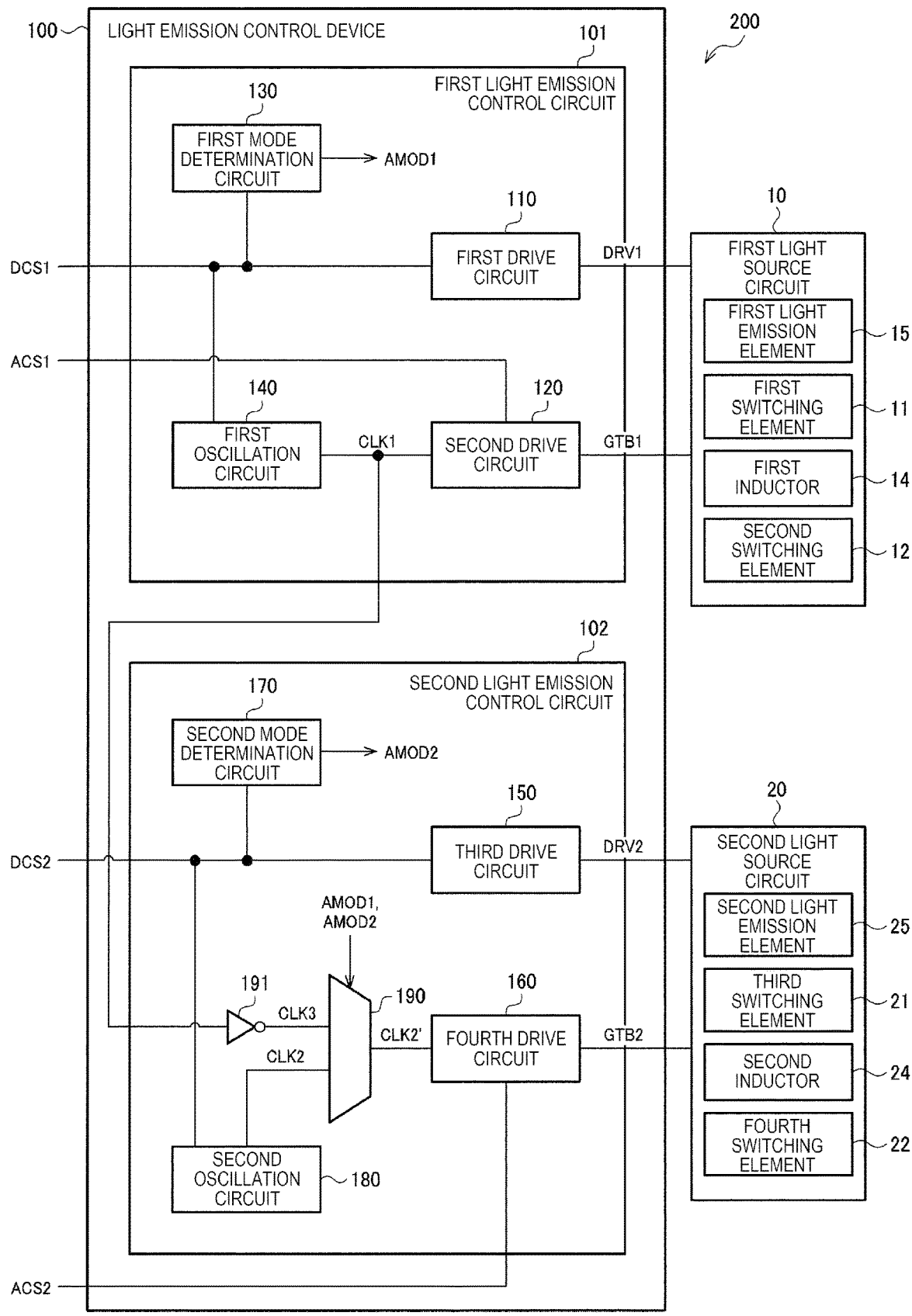
FIG. 1 is a configuration example of a light source device.

FIG. 1 is a configuration example of a light source device 200. The light source device 200 includes a light emission control device 100, a first light source circuit 10, and a second light source circuit 20. The light emission control device 100 is, for example, an integrated circuit device, and is realized by, for example, a semiconductor chip.

The first light source circuit 10 includes a first light emission element 15, a first switching element 11, a first inductor 14, and a second switching element 12. The first inductor 14 and the second switching element 12 switch and regulate a current flowing through the first light emission element 15. The first switching element 11 performs PWM (Pulse Width Modulation) control on the current flowing through the first light emission element 15 by turning on and off the current flowing through the first light emission element 15. Details of the first light source circuit 10 will be described later with reference to FIG. 2 or the like.

The first light source circuit 20 includes a second light emission element 25, a third switching element 21, a second inductor 24, and a fourth switching element 22. The second inductor 24 and the fourth switching element 22 switch and regulate a current flowing through the second light emission element 25. The third switching element 21 performs PWM control on the current flowing through the second light emission element 25 by turning on and off the current flowing through the second light emission element 25.

The light emission control device 100 includes a first light emission control circuit 101 controlling light emission of the first light emission element 15, and a second light emission control circuit 102 controlling light emission of the second light emission element 25. The light emission control device 100 receives a first PWM signal DCS1, a first dimming voltage ACS1, a second PWM signal DCS2, and a second dimming voltage ACS2 from a processing device provided outside the light emission control device 100. The processing device is a host device of the light emission control device 100, and is, for example, a processor such as an MPU or a CPU.

The first light emission control circuit 101 includes a first drive circuit 110, a second drive circuit 120, a first mode determination circuit 130, and a first oscillation circuit 140. The first drive circuit 110 outputs a first control signal DRV1 for controlling turning on/off of the first switching element 11 based on the first PWM signal DCS1. The first oscillation circuit 140 generates a first clock signal CLK1. The second drive circuit 120 outputs a second control signal GTB1 for controlling turning on/off of the second switching element 12 based on the first dimming voltage ACS1 and the first clock signal CLK1. The first mode determination circuit 130 determines a dimming mode of the first light emission control circuit 101 based on the first PWM signal DCS1, and outputs a first dimming mode determination signal AMOD1 that is a determination result thereof. Details of the first light emission control circuit 101 will be described with reference to FIG. 2 or the like.

The second light emission control circuit 102 includes a third drive circuit 150, a fourth drive circuit 160, a second mode determination circuit 170, a second oscillation circuit 180, a selector 190, and an inverter 191. The third drive circuit 150 outputs a third control signal DRV2 for controlling turning on/off of the third switching element 21 based on the second PWM signal DCS2. The second mode determination circuit 170 determines a dimming mode of the second light emission control circuit 102 based on the second PWM signal DCS2, and outputs a second dimming mode determination signal AMOD2 that is a determination result thereof. The second oscillation circuit 180 generates the second clock signal CLK2. The inverter 191 outputs a third clock signal CLK3 by inverting a phase of the first clock signal CLK1. That is, the inverter 191 is a clock phase shift circuit that shifts the phase of the first clock signal CLK1 by 180 degrees. The selector 190 selects the third clock signal CLK3 that is an inverted signal of the first clock signal CLK1 or the second clock signal CLK2 based on the first dimming mode determination signal AMOD1 and the second dimming mode determination signal AMOD2, and outputs the third clock signal CLK3 or the second clock signal CLK2 as a clock signal CLK2'. The fourth drive circuit 160 outputs a fourth control signal GTB2 for controlling turning on/off of the fourth switching element 22 based on the second dimming voltage ACS2 and the clock signal CLK2'.

First, an operation in the dimming mode will be described using the first light emission control circuit 101 and the first light source circuit 10 as an example. Thereafter, dimming mode determination and clock phase control using the determination result will be described.

Figure 2:
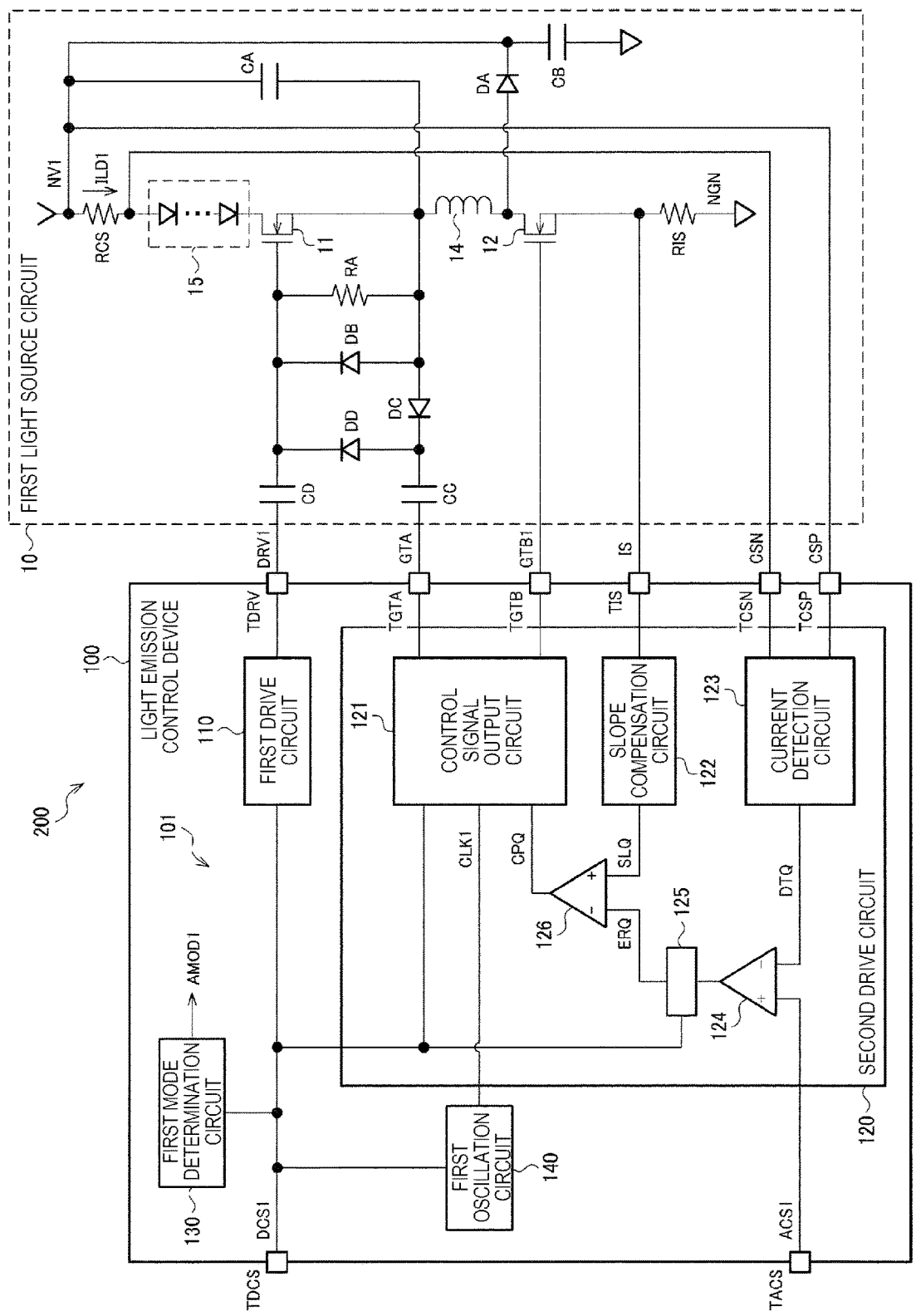
FIG. 2 is a detailed configuration example of a first light emission control circuit and a first light source circuit.

FIG. 2 is a detailed configuration example of the first light emission control circuit 101 and the first light source circuit 10. Basic configurations and operations of the second light emission control circuit 102 and the second light source circuit 20 are the same as those except for the selector 190 and the inverter 191.

As illustrated in FIG. 2, the first light source circuit 10 includes the first switching element 11, the second switching element 12, the first inductor 14, and the first light emission element 15. The first light source circuit 10 includes resistors RCS, RIS, and RA, capacitors CA to CD, and diodes DA to DD. FIG. 2 illustrates a case in which the first switching element 11 and the second switching element 12 are N-type transistors, but these switching elements are not limited to the N-type transistors.

The first light emission element 15 is driven by a current ILD1, and emits light with brightness according to a current value of the current ILD1. The first light emission element 15 is a plurality of laser diodes coupled in series with each other. However, the first light emission element 15 may be a single laser diode or a light emitting diode (LED).

The first light emission element 15 and the first switching element 11 are provided in series between a first power source node NVI and one end of the first inductor 14. The second switching element 12 is provided between the other end of the first inductor 14 and a second power source node NGN. Specifically, a resistor RCS is coupled between the first power source node NVI and one end of the first light emission element 15, the other end of the first light emission element 15 is coupled to a drain of the first switching element 11, and a source of the first switching element 11 is coupled to one end of the first inductor 14. The other end of the first inductor 14 is coupled to a drain of the second switching element 12, and a resistor RIS is coupled between a source of the second switching element 12 and the second power source node NGN. The first power source node NVI is a node to which a first power source is input, and the second power source node NGN is anode to which a second power source is input. A voltage of the first power source is higher than a voltage of the second power source. The second power source is, for example, a ground. Coupling relationships of the resistor RA, the capacitors CA to CD, and the diodes DA to DD are as illustrated in FIG. 2, and an operation of the first light source circuit 10 including these circuit elements will be described later with reference to FIGS. 3 and 4.

The second switching element 12 performs switching regulation control of the current flowing through the first inductor 14. The first switching element 11 controls whether or not the current flowing through the first inductor 14 flows through the first light emission element 15. Although details will be described later, a mode, in which the first switching element 11 is always turned on and a light emission amount of the first light emission element 15 is controlled by the switching regulation control of the second switching element 12, is referred to as an analog dimming mode. Further, a mode, in which the light emission amount of the first light emission element 15 is controlled by the on-duty when the first switching element 11 is turned on and off, is referred to as a PWM dimming mode. Here, the first switching element 11 is periodically and repeatedly turned on and off, and a ratio of a period, in which the first switching element 11 is turned on in one cycle, is referred to as the on-duty. As will be described later with reference to FIG. 4, the duty of the first PWM signal DCS1 is (THW/TPWM)×100%, which corresponds to the on-duty of the first switching element 11.

The first light emission control circuit 101 includes a PWM terminal TDCS, the first drive circuit 110, the second drive circuit 120, and the first mode determination circuit 130. The first light emission control circuit 101 includes the first oscillation circuit 140, a dimming voltage input terminal TACS, and terminals TDRV, TGTA, TGTB, TIS, TCSP, and TCSN.

The first PWM signal DCS1 used for dimming control in the PWM dimming mode is input from the processing device to the PWM terminal TDCS. The first dimming voltage ACS1 used for dimming control in the analog dimming mode is input from the processing device to the dimming voltage input terminal TACS.

The first drive circuit 110 outputs the first control signal DRV1 for controlling turning on or off of the first switching element 11 based on the first PWM signal DCS1. The first control signal DRV1 is output from the terminal TDRV and input to a gate of the first switching element 11 via the capacitor CD. The first drive circuit 110 outputs the first control signal DRV1 for turning on of the first switching element 11 when the first PWM signal DCS1 is active, and outputs the first control signal DRV1 for turning off of the first switching element 11 when the first PWM signal DCS1 is inactive. The first drive circuit 110 is configured by, for example, a buffer circuit that buffers the first PWM signal DCS1, or the like.

The first oscillation circuit 140 generates the first clock signal CLK1. For example, the first oscillation circuit 140 is a CR oscillation circuit, a ring oscillator, a multivibrator, or the like.

The second drive circuit 120 outputs the second control signal GTB1 based on the first dimming voltage ACS1, the first PWM signal DCS1, and the first clock signal CLK1. The second control signal GTB1 is output from the terminal TGTB and input to a gate of the second switching element 12. The second control signal GTB1 controls turning on/off of the second switching element 12 in a period in which the first PWM signal DCS1 is active. Specifically, the voltage CSP at one end of the resistor RCS is input to the terminal TCSP, the voltage CSN at the other end of the resistor RCS is input to the terminal TCSN, and the voltage IS at one end of the resistor RIS is input to the terminal TIS. The second drive circuit 120 performs switching regulation control on the current ILD1 flowing through the first light emission element 15 based on the voltages CSP, CSN, and IS, and the first dimming voltage ACS1, thereby performing control to be the current ILD1 corresponding to the first dimming voltage ACS1.

The second drive circuit 120 outputs a control signal GTA that assists the operation of the first switching element 11. The control signal GTA and the second control signal GTB1 are basically the same, but the second control signal GTB1 may be different from the control signal GTA. Specifically, when the first PWM signal DCS1 is equal to or less than a predetermined duty, the second control signal GTB1 may be inactive when a predetermined period elapses after the first PWM signal DCS1 is inactive. The control signal GTA may be input to the gate of the second switching element 12 as the second control signal. In this case, the terminal TGTB is omitted.

The second drive circuit 120 includes a control signal output circuit 121, a slope compensation circuit 122, a current detection circuit 123, an error amplifier circuit 124, a switch circuit 125, and a comparator 126. Hereinafter, an operation of each portion of the second drive circuit 120 and each dimming mode of the first drive circuit 110 will be described with reference to waveform diagrams of FIGS. 3 and 4. In the following, active is set to a high level and inactive is set to a low level.

Figure 3:
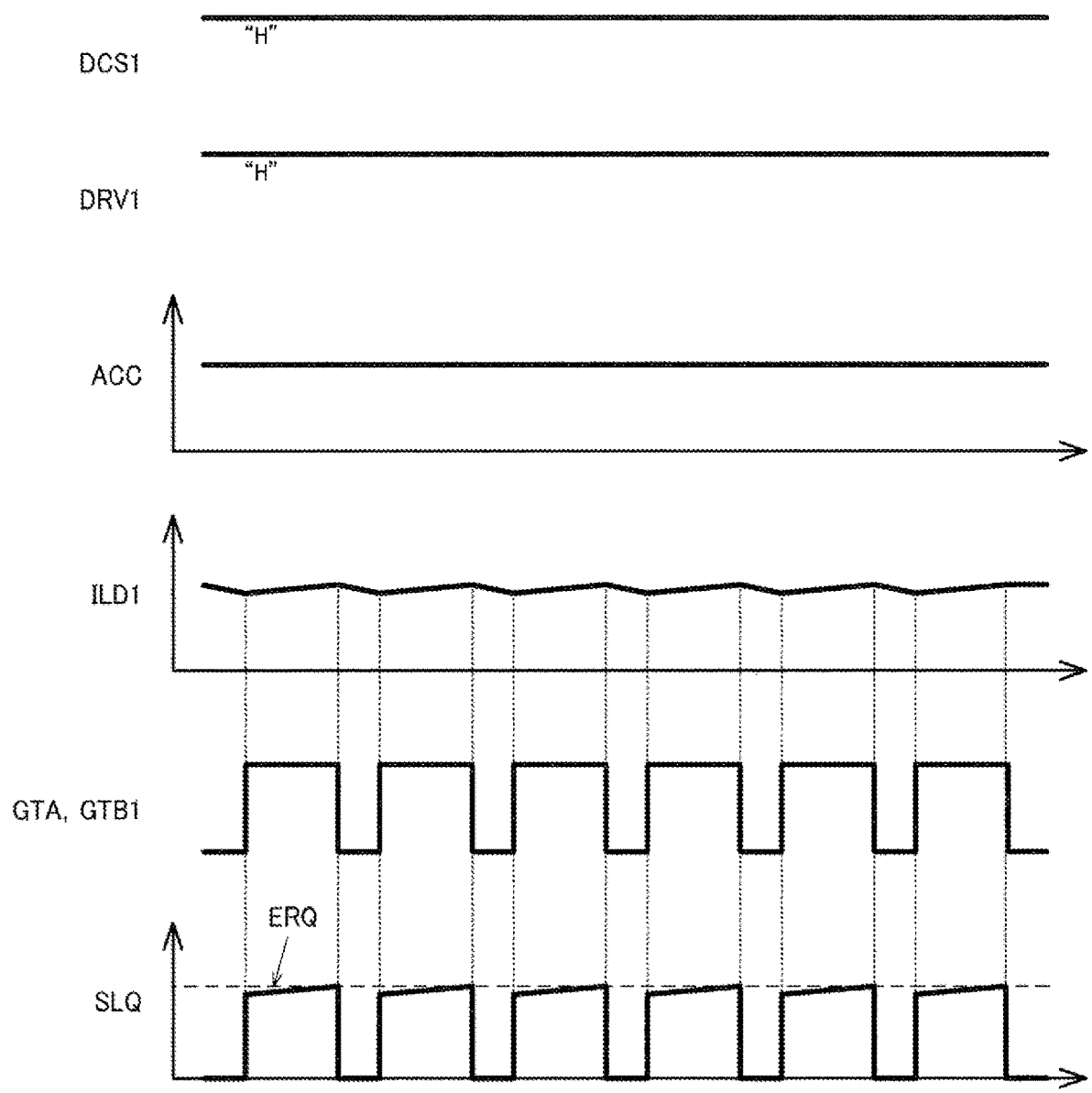
FIG. 3 is a waveform diagram in an analog dimming mode.

FIG. 3 is a waveform diagram in the analog dimming mode. In the analog dimming mode, the first PWM signal DCS1 is at the high level. The first drive circuit 110 always turns on the first switching element 11 by outputting the first control signal DRV1 of the high level. In the PWM dimming mode, the first PWM signal DCS1 is a rectangular wave having a high width duty less than 100%. The first PWM signal DCS1 that is always at the high level in the analog dimming mode is a PWM signal having a high width duty of 100%.

The current detection circuit 123 outputs a detection voltage DTQ by multiplying a potential difference CSP−CSN=RCS×ILD between both ends of the resistor RCS by a given gain. The error amplifier circuit 124 amplifies an error between the detection voltage DTQ and the first dimming voltage ACS1. The switch circuit 125 is turned on when the first PWM signal DCS1 is at the high level, and is turned off when the first PWM signal DCS1 is at the low level. In the analog dimming mode, the switch circuit 125 is always turned on.

The slope compensation circuit 122 increases a slope of the voltage IS over time in order to suppress subharmonic oscillation of the drive current flowing through the laser diode, and outputs the voltage SLQ after the increase in the slope. The comparator 126 compares the voltage SLQ with the output voltage ERQ of the error amplifier circuit 124, outputs the signal CPQ of the low level when SLQ<ERQ, and outputs the signal CPQ of the high level when SLQ>ERQ.

The control signal output circuit 121 allows the second control signal GTB1 to transition from the low level to the high level at an edge of the first clock signal CLK1. Since the second switching element 12 is turned on when the second control signal GTB1 is at the high level, a current flows from the first inductor 14 to the second power source node NGN via the second switching element 12 and the resistor RIS. Since the current flowing through the first inductor 14 increases, the voltage IS increases and the output voltage SLQ of the slope compensation circuit 122 increases. Since the current flowing through the first inductor 14 flows through the first light emission element 15 via the first switching element 11, the current ILD1 flowing through the first light emission element 15 also increases.

When SLQ>ERQ, the output signal CPQ of the comparator 126 transitions from the low level to the high level. In this case, the control signal output circuit 121 allows the second control signal GTB1 to transition from the high level to the low level. When the second control signal GTB1 is at the low level, the second switching element 12 is turned off, so that a current flows from the first inductor 14 to the first power source node NVI via the diode DA. Since the current flowing through the first inductor 14 decreases, the current ILD1 flowing through the first light emission element 15 also decreases.

When the detection voltage DTQ that is a detection result of the current ILD1 is different from the first dimming voltage ACS1, the output voltage ERQ of the error amplifier circuit 124 changes, so that the duty of the second control signal GTB1 changes. Thus, the current ILD1 is feedback-controlled so that the detection voltage DTQ matches the first dimming voltage ACS1. Such feedback control keeps the current ILD1 constant. Control for keeping the current ILD1 constant is called switching regulation control. The current ILD1 is maintained at a current value corresponding to the first dimming voltage ACS1, and when the processing device changes the first dimming voltage ACS1, the current ILD1 changes accordingly. That is, in the analog dimming mode, the light emission amount of the first light emission element 15 is dimmed by the first dimming voltage ACS1.

The control signal GTA will be described. The control signal GTA has a same waveform as that of the second control signal GTB1. The diode DB and the resistor RA are coupled as protection elements between the gate and the source of the first switching element 11. Since the first control signal DRV1 is DC-cut by the capacitor CD, the voltage between the gate and the source of the first switching element 11 gradually decreases via the resistor RA. Therefore, the control signal GTA is output to maintain the voltage between the gate and the source.

Specifically, the control signal GTA is input to one end of the capacitor CC. When the control signal GTA is at the low level, the voltage at the other end of the capacitor CC is the source voltage of the first switching element 11 via the diode DC. A potential difference when the control signal GTA transitions from the low level to the high level is referred to as a transition voltage. When the control signal GTA transitions from the low level to the high level, the voltage at the other end of the capacitor CC increases by the transition voltage, so that the voltage is supplied to the gate of the first switching element 11 via the diode DD. Therefore, the voltage between the gate and the source of the first switching element 11 becomes a transition voltage, so that the decrease in the voltage due to the resistor RA is compensated. In the above description, the voltage drop in the diode is ignored.

The analog dimming mode described above is used from a maximum value of the current ILD1 to a predetermined value. That is, when the first light emission element 15 emits the light with high luminance, the analog dimming mode is used. On the other hand, when the current ILD1 is less than a predetermined value, that is, when the first light emission element 15 emits the light with low luminance, the PWM dimming mode is used.

FIG. 4 is a waveform diagram in the PWM dimming mode. The cycle of the first PWM signal DCS1 is TPWM, and the period in which the first PWM signal DCS1 is at the high level is THW. THW is also called a length of the active period or a pulse width. The duty of the first PWM signal DCS1 is (THW/TPWM)×100% . The frequency of the second control signal GTB1 is set higher than the frequency of the first PWM signal DCS1.

When the first PWM signal DCS1 is at the high level, the first drive circuit 110 outputs the first control signal DRV1 of the high level, and turns on the first switching element 11. In this case, the second drive circuit 120 performs the switching regulation control by switching the second control signal GTB1. Therefore, the current ILD1 corresponding to the first dimming voltage ACS1 flows through the first light emission element 15. When the first PWM signal DCS1 is at the low level, the first drive circuit 110 outputs the first control signal DRV1 of the low level, and turns off the first switching element 11. The second drive circuit 120 sets the second control signal GTB1 to the low level. In this case, no current flows through the first light emission element 15.

Since a time average of the current ILD1 flowing through the first light emission element 15 is determined by the duty of the first PWM signal DCS1, the light emission amount is also determined by the duty of the first PWM signal DCS1. Thus, in the PWM dimming mode, the dimming control is performed by the duty of the first PWM signal DCS1. On the other hand, the current value when the current ILD1 flows through the first light emission element 15 is ensured to be higher than the time average. In order to cause the laser diode to emit light, it is necessary for the current ILD1 of a threshold value or more to flow through the laser diode. By performing the PWM control as described above, it is possible to cause the laser diode to emit light by causing the current ILD1 of the threshold value or more to flow, and to perform dimming as the time average.

Hereinafter, the analog dimming mode of the first light emission control circuit 101 is referred to as a first analog dimming mode, and the analog dimming mode of the second light emission control circuit 102 is referred to as a second analog dimming mode. The PWM dimming mode of the first light emission control circuit 101 is referred to as a first PWM dimming mode, and the PWM dimming mode of the second light emission control circuit 102 is referred to as a second PWM dimming mode.

2. Dimming Mode Determination and Clock Phase Control

Hereinafter, dimming mode determination performed by the light emission control device 100 of FIG. 1 and clock phase control using a determination result will be described. FIG. 5 is a diagram for explaining an operation of the selector 190 according to the dimming mode.

When it is not AMOD1=AMOD2=H, that is, when one or both of the first light emission control circuit 101 and the second light emission control circuit 102 are in the PWM dimming mode, the selector 190 outputs the second clock signal CLK2 as the clock signal CLK2'. That is, the second drive circuit 120 of the first light emission control circuit 101 performs the switching regulation control using the first clock signal CLK1, and the fourth drive circuit 160 of the second light emission control circuit 102 performs the switching regulation control using the second clock signal CLK2.

On the other hand, when AMOD1=AMOD2=H, that is, when both the first light emission control circuit 101 and the second light emission control circuit 102 are in the analog dimming mode, the selector 190 outputs the third clock signal CLK3 that is an inverted signal of the first clock signal CLK1, as the clock signal CLK2'. That is, the second drive circuit 120 of the first light emission control circuit 101 and the fourth drive circuit 160 of the second light emission control circuit 102 perform the switching regulation control using clock signals having opposite phases. In FIG. 5, the inverted signal is indicated by adding a bar on CLK1.

Figure 6:
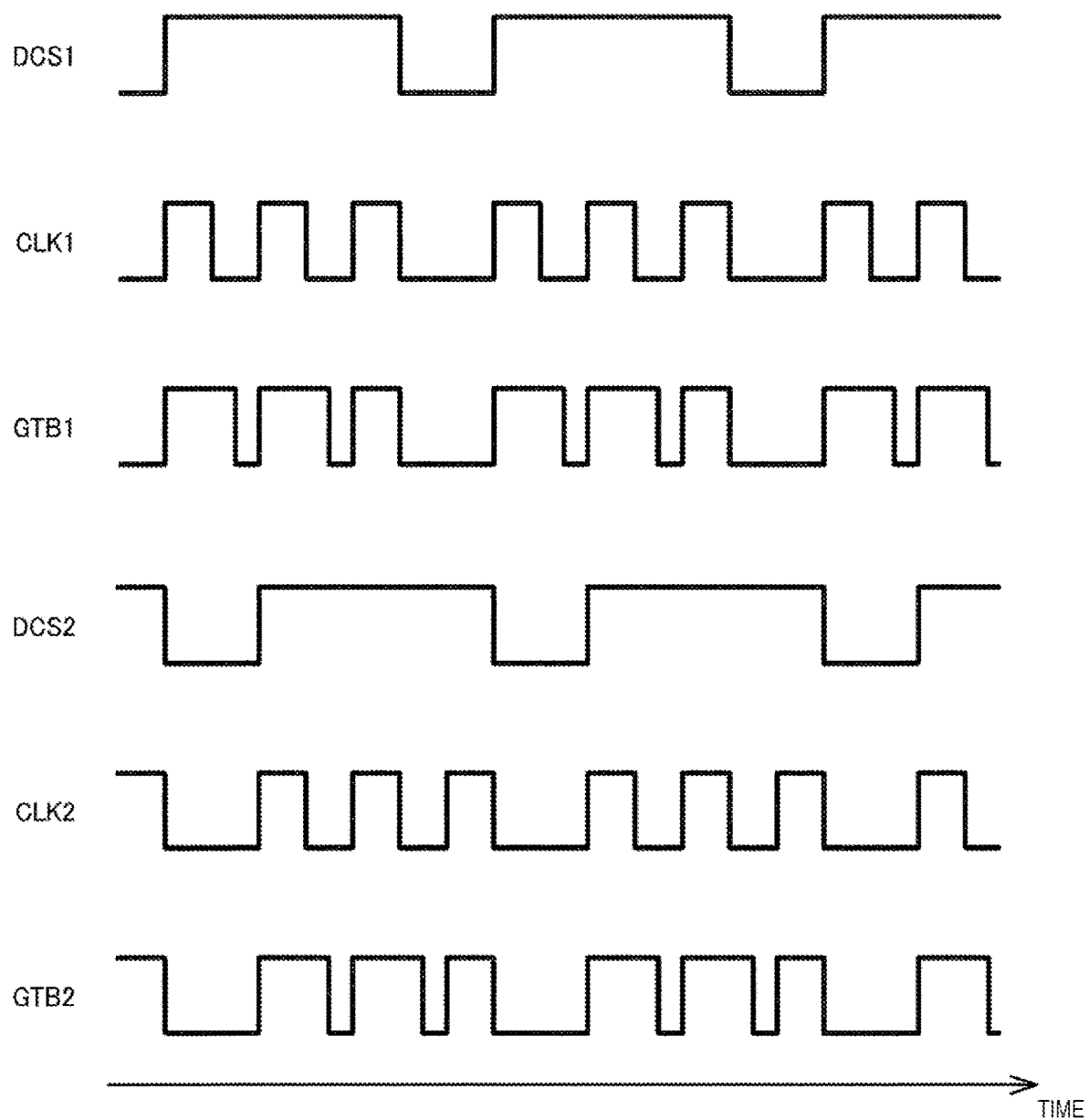
FIG. 6 is a waveform diagram when one or both of a first light emission control circuit and a second light emission control circuit are in a PWM dimming mode.

First, the clock phase control when one or both of the first light emission control circuit 101 and the second light emission control circuit 102 are in the PWM dimming mode will be described with reference to FIG. 6. FIG. 6 illustrates a waveform diagram as an example when both the first light emission control circuit 101 and the second light emission control circuit 102 are in the PWM dimming mode. In FIG. 6, a rising edge of the PWM signal corresponds to the active edge.

The first light emission control circuit 101 controls the phase of the second control signal GTB1 based on the first PWM signal DCS1. Specifically, the first oscillation circuit 140 stops the oscillation when the first PWM signal DCS1 is at the low level, and starts the oscillation with the rising edge of the first PWM signal DCS1 as a trigger. That is, assuming that the rising edge of the first clock signal CLK1 has a phase of 0 degrees, when the first PWM signal DCS1 changes from the low level to the high level, the first clock signal CLK1 is output from the phase of 0 degrees. The second drive circuit 120 outputs the second control signal GTB1 having a phase of 0 degrees at the rising edge of the first clock signal CLK1. That is, at the rising edge of the first PWM signal DCS1, the second control signal GTB1 starts to be output from the phase of 0 degrees.

Similarly, the second light emission control circuit 102 controls the phase of the fourth control signal GTB2 based on the second PWM signal DCS2. Specifically, the second oscillation circuit 180 stops the oscillation when the second PWM signal DCS2 is at the low level, and starts the oscillation with the rising edge of the second PWM signal DCS2 as a trigger. That is, when the second PWM signal DCS2 changes from the low level to the high level, the second clock signal CLK2 is output from the phase of 0 degrees. The fourth drive circuit 160 outputs the fourth control signal GTB2 having a phase of 0 degrees at the rising edge of the second clock signal CLK2. That is, at the rising edge of the second PWM signal DCS2, the fourth control signal GTB2 starts to be output from the phase of 0 degrees.

According to the present embodiment described above, when the switching of the second switching element 12 is restarted at the rising edge of the first PWM signal DCS1, the second control signal GTB1 starts from the phase of 0 degrees. Similarly, when the switching of the fourth switching element 22 is restarted at the rising edge of the second PWM signal DCS2, the fourth control signal GTB2 starts from the phase of 0 degrees. Therefore, since the on period when the switching of the switching element is restarted is not shortened, sufficient energy is accumulated in the inductor, and a sufficient current can flow through the light emission element.

Next, clock phase control when both the first light emission control circuit 101 and the second light emission control circuit 102 are in the analog dimming mode will be described. First, a problem when the first light emission control circuit 101 and the second light emission control circuit 102 perform the switching regulation control in the same phase will be described with reference to FIG. 7.

Figure 7:
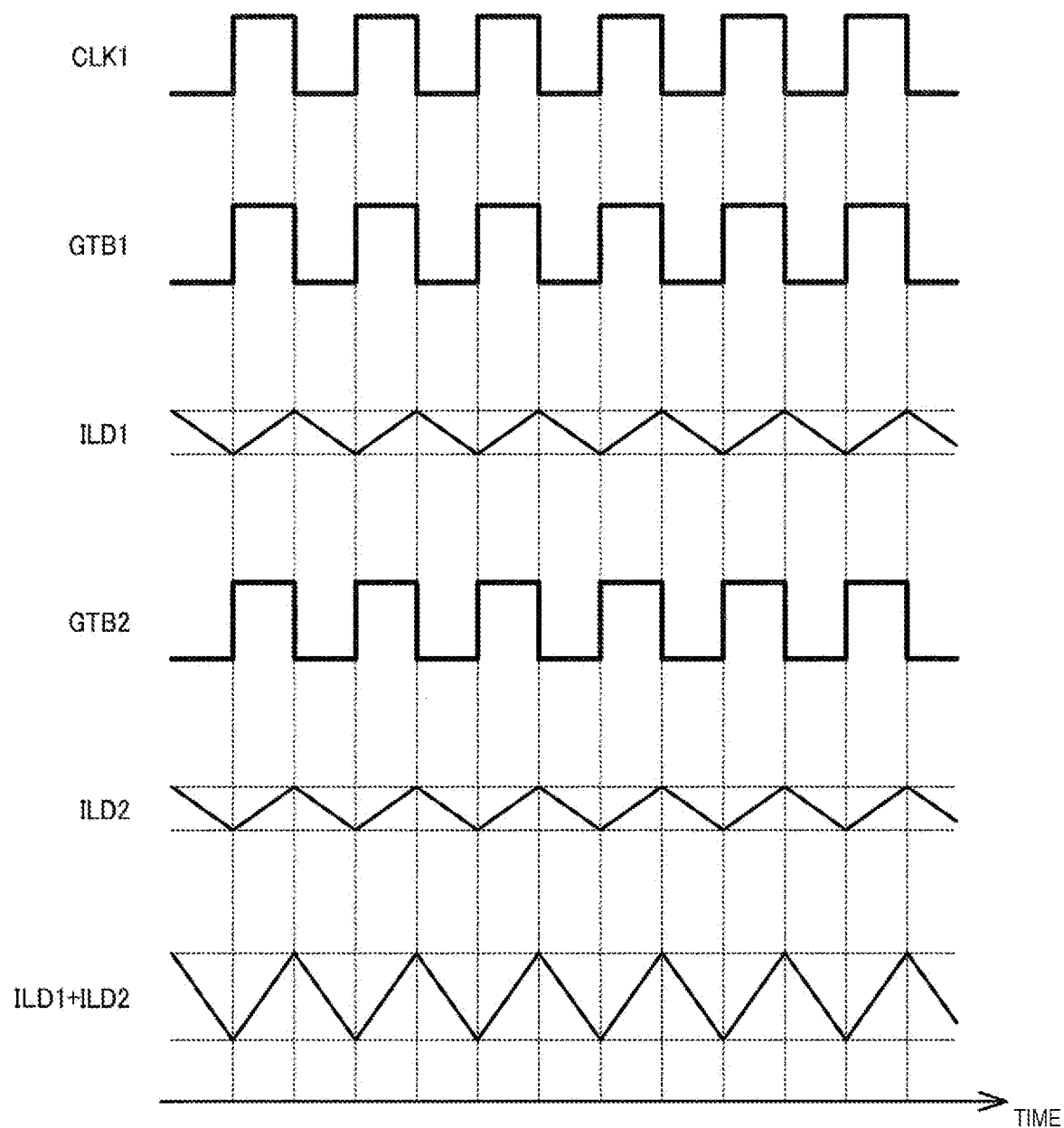
FIG. 7 is a waveform diagram for explaining a problem when the first light emission control circuit and the second light emission control circuit perform a switching regulation control in a same phase.

As illustrated in FIG. 7, it is assumed that the phase of the second control signal GTB1 and the fourth control signal GTB2 is 0 degrees at the rising edge of the first clock signal CLK1. In this case, since the second switching element 12 and the fourth switching element 22 are turned on and off in the same phase, a ripple of the current ILD1 flowing through the first light emission element 15 and a ripple of the current ILD2 flowing through the second light emission element 25 are generated in the same phase. Then, since a ripple amplitude of ILD1+ILD2 is a sum of a ripple amplitude of ILD1 and a ripple amplitude of ILD2, a maximum value of ILD1+ILD2 increases. Since the current ILD1+ILD2 is a load of the power source circuit that supplies power to the first light source circuit 10 and the second light source circuit 20, there is a problem that the maximum load of the power source circuit increases and a power source with a large capacity is required.

Figure 8:
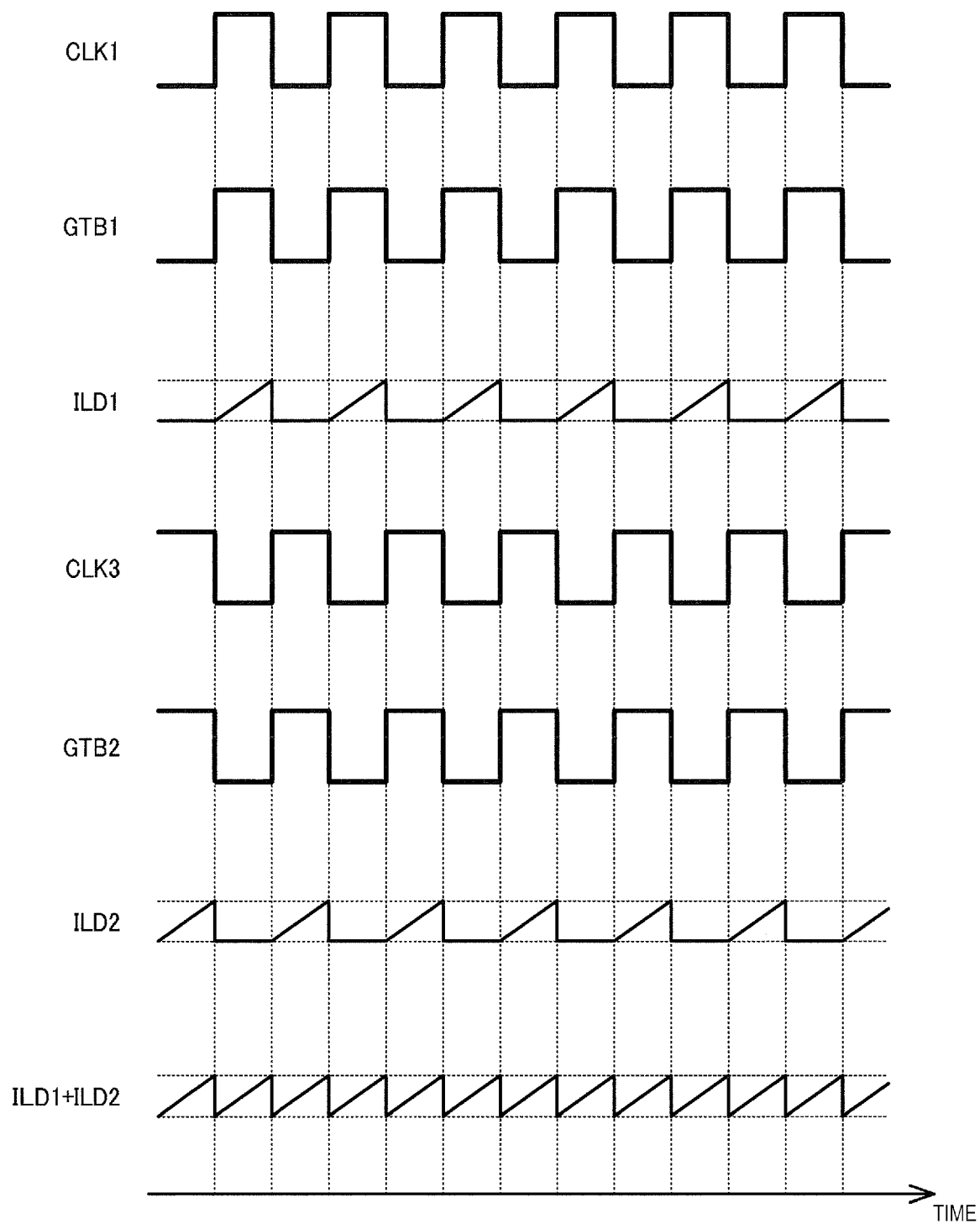
FIG. 8 is a waveform diagram when both the first light emission control circuit and the second light emission control circuit are in an analog dimming mode.

FIG. 8 is a waveform diagram when both the first light emission control circuit 101 and the second light emission control circuit 102 are in the analog dimming mode in the present embodiment.

In the present embodiment, when both the first light emission control circuit 101 and the second light emission control circuit 102 are in the analog dimming mode, the fourth control signal GTB2 is output based on the third clock signal CLK3 in which the phase of the first clock signal CLK1 is inverted. That is, since the phase of the second control signal GTB1 and the phase of the fourth control signal GTB2 are shifted by 180 degrees, the second switching element 12 and the fourth switching element 22 are turned on and off in opposite phases. Therefore, the ripple of the current ILD1 flowing through the first light emission element 15 and the ripple of the current ILD2 flowing through the second light emission element 25 are generated in opposite phases, so that the ripple amplitude of ILD1+ILD2 is reduced compared to the case of FIG. 7. Since the load of the power source circuit is reduced by reducing the ripple amplitude of ILD1+ILD2, the capacity of the power source circuit can be reduced.

3. Second Method

A second method of the dimming mode determination performed by the light emission control device 100 and the clock phase control using the determination result will be described.

Figure 9:
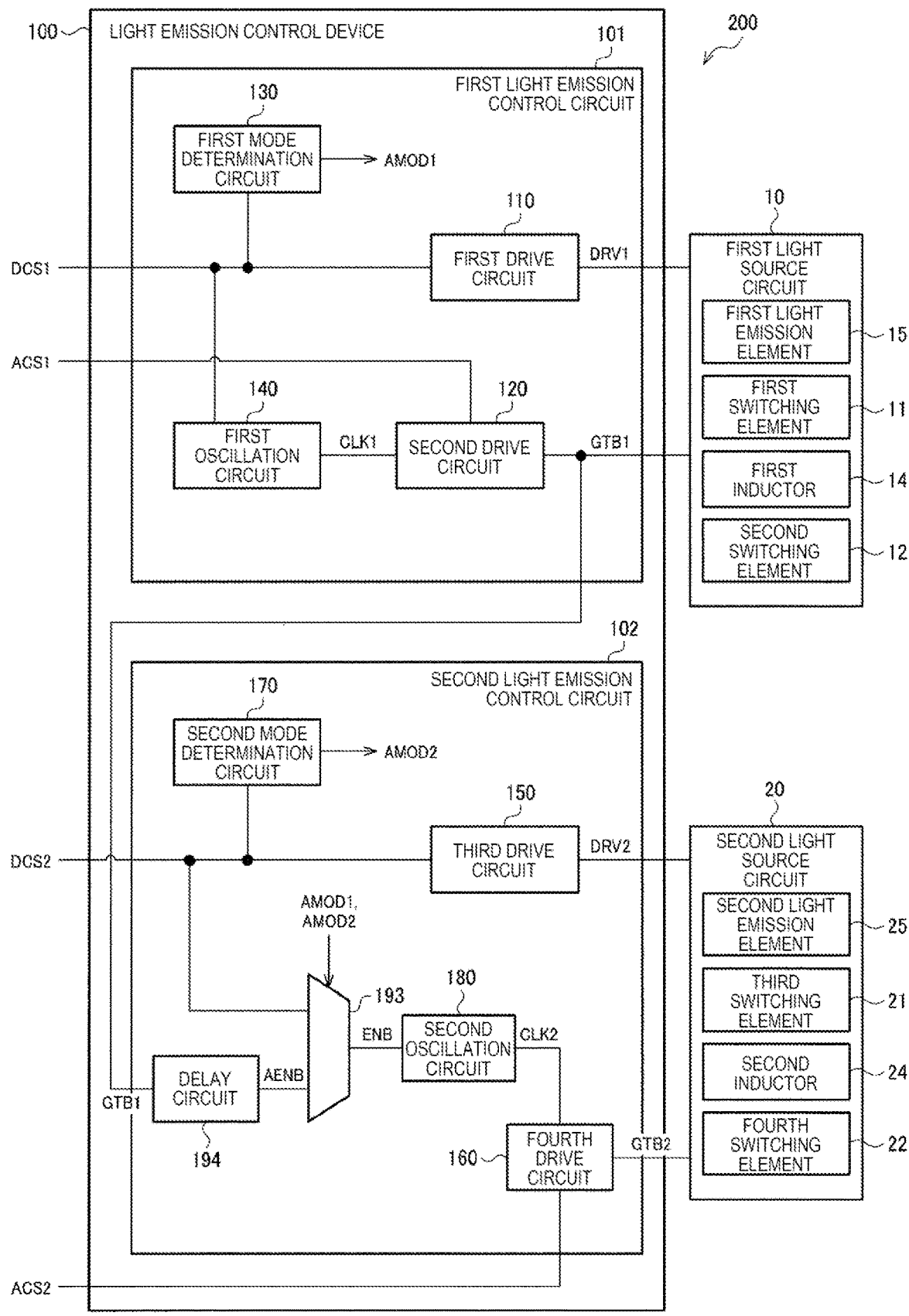
FIG. 9 is a second configuration example of the second light emission control circuit.

FIG. 9 illustrates a second configuration example of the second light emission control circuit 102. A first light emission control circuit 101 has the same configuration as that in FIG. 1. In FIG. 9, the second light emission control circuit 102 includes a selector 193, a delay circuit 194, a third drive circuit 150, a fourth drive circuit 160, a second mode determination circuit 170, and a second oscillation circuit 180.

The delay circuit 194 outputs an enable signal AENB of the second oscillation circuit 180 based on a second control signal GTB1. Specifically, the delay circuit 194 delays the second control signal GTB1 by a delay amount corresponding to a period in which the second control signal GTB1 is active, and outputs the enable signal AENB based on the delayed second control signal GTB1.

The selector 193 selects the second PWM signal DCS2 or the enable signal AENB based on the first dimming mode determination signal AMOD1 and the second dimming mode determination signal AMOD2, and outputs to the second oscillation circuit 180 as the enable signal ENB. The second oscillation circuit 180 starts the oscillation when the enable signal ENB changes from active to inactive.

Figure 10:
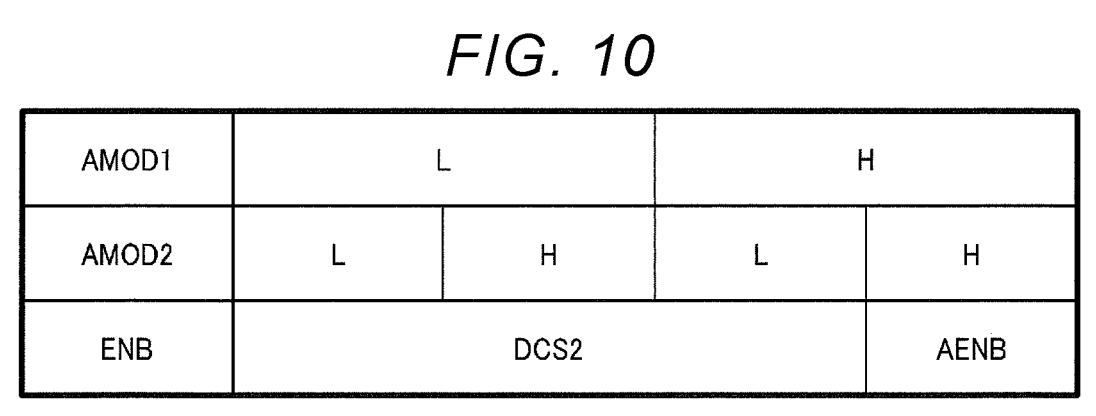

FIG. 10 is a diagram for explaining an operation of the selector 193 according to the dimming mode. When it is not AMOD1=AMOD2=H, that is, when one or both of the first light emission control circuit 101 and the second light emission control circuit 102 are in the PWM dimming mode, the selector 193 outputs the second PWM signal DCS2 as the enable signal ENB. That is, the second oscillation circuit 180 starts the oscillation based on the second PWM signal DCS2, and outputs the second clock signal CLK2.

On the other hand, when AMOD1=AMOD2=H, that is, when both the first light emission control circuit 101 and the second light emission control circuit 102 are in the analog dimming mode, the selector 193 outputs the enable signal AENB from the delay circuit 194 as the enable signal ENB. That is, the second oscillation circuit 180 starts the oscillation based on the enable signal AENB from the delay circuit 194, and outputs the second clock signal CLK2.

When one or both of the first light emission control circuit 101 and the second light emission control circuit 102 are in the PWM dimming mode, the operation is the same as that in the waveform diagram of FIG. 8. Therefore, the waveform diagram and the description are omitted here.

Figure 11:
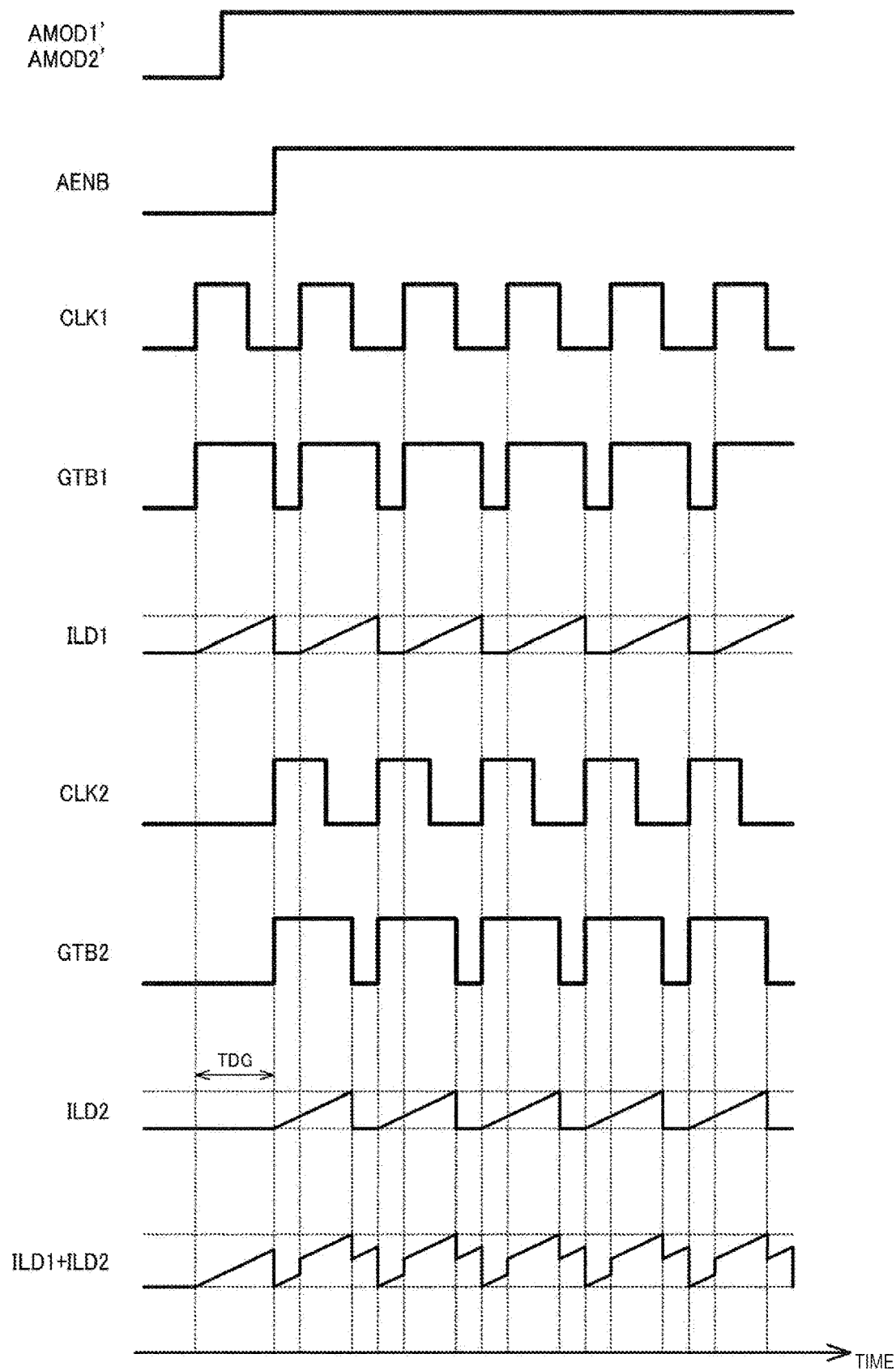
FIG. 11 is a waveform diagram when both the first light emission control circuit and the second light emission control circuit are in an analog dimming mode.

FIG. 11 is a waveform diagram when both the first light emission control circuit 101 and the second light emission control circuit 102 are in the analog dimming mode.

When the second control signal GTB1 first changes from the high level to the low level after AMOD1 andAMOD2 change from the low level to the high level, the delay circuit 194 changes the enable signal AENB from the low level to the high level. When AMOD1 and AMOD2 transition at different timings, when the second control signal GTB1 first changes from the high level to the low level after a logical product of AMOD1 and AMOD2 changes from the low level to the high level, the delay circuit 194 changes the enable signal AENB from the low level to the high level.

When the enable signal AENB is changed from the low level to the high level, the second oscillation circuit 180 starts the oscillation. That is, when the enable signal AENB is changed from the low level to the high level, the second clock signal CLK2 starts from the phase of 0 degrees. Therefore, the fourth drive circuit 160 outputs the fourth control signal GTB2 delayed by the delay time TDG with respect to the second control signal GTB1. The delay time TDG corresponds to the active period of the second control signal GTB1.

According to the present embodiment, the switching phase of the second switching element 12 by the second control signal GTB1 and the switching phase of the fourth switching element 22 by the fourth control signal GTB2 are shifted by the delay time TDG corresponding to the active period of the second control signal GTB1. Therefore, the timing at which the current ILD1 flowing through the first light emission element 15 is maximized and the timing at which the current ILD2 flowing through the second light emission element 25 is maximized can be shifted. That is, compared with the case of FIG. 7, the ripple amplitude of ILD1+ILD2 can be reduced, so that the load on the power source circuit can be reduced.

The delay time TDG does not have to be the same as the active period of the second control signal GTB1, and may be a time controlled by the active period or the duty of the second control signal GTB1. For example, as will be described later with reference to FIG. 13, the delay time TDG may be longer than the active period of the second control signal GTB1.

Figure 12:
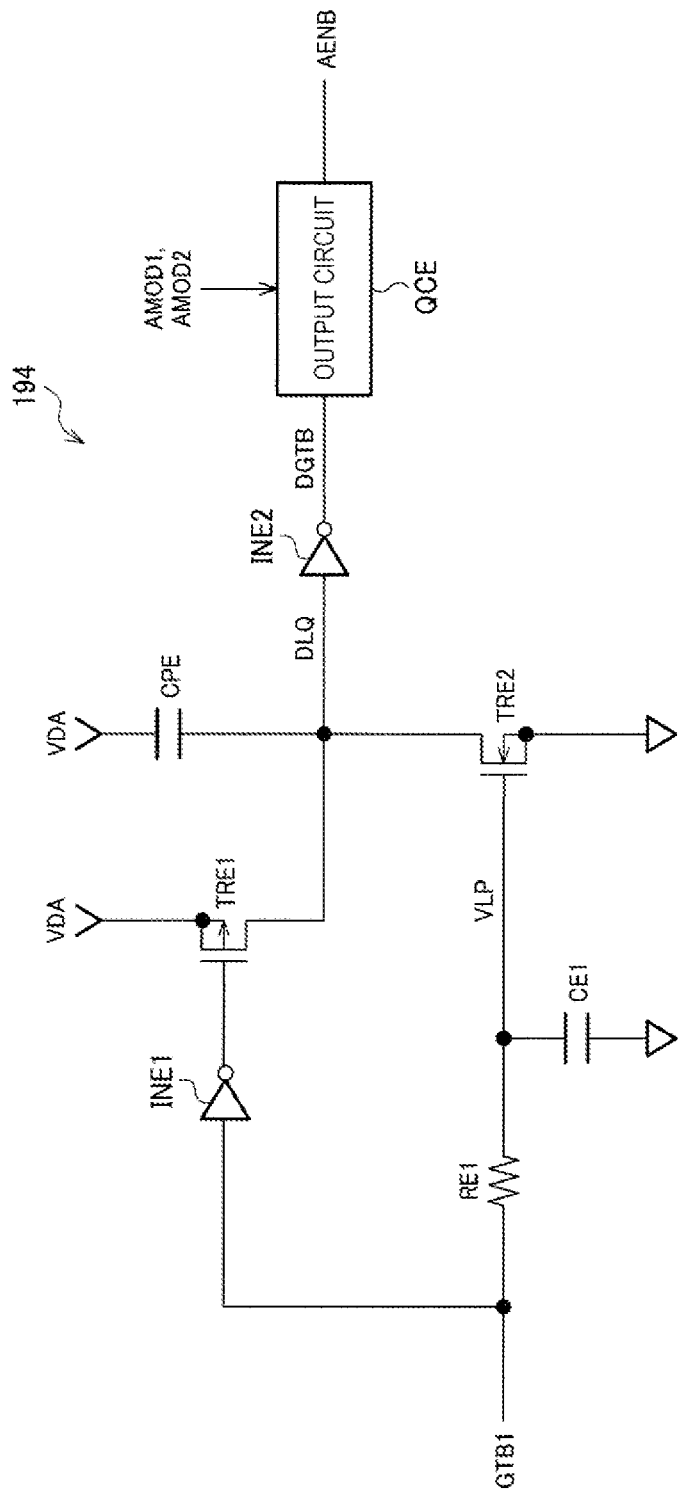
FIG. 12 is a detailed configuration example of a delay circuit.

FIG. 12 is a detailed configuration example of the delay circuit 194. The delay circuit 194 includes a resistor RE1, capacitors CE1 and CPE, transistors TRE1 and TRE2, inverters INE1 and INE2, and an output circuit QCE. The transistor TRE1 is a P-type transistor and the transistor TRE2 is an N-type transistor.

Figure 13:
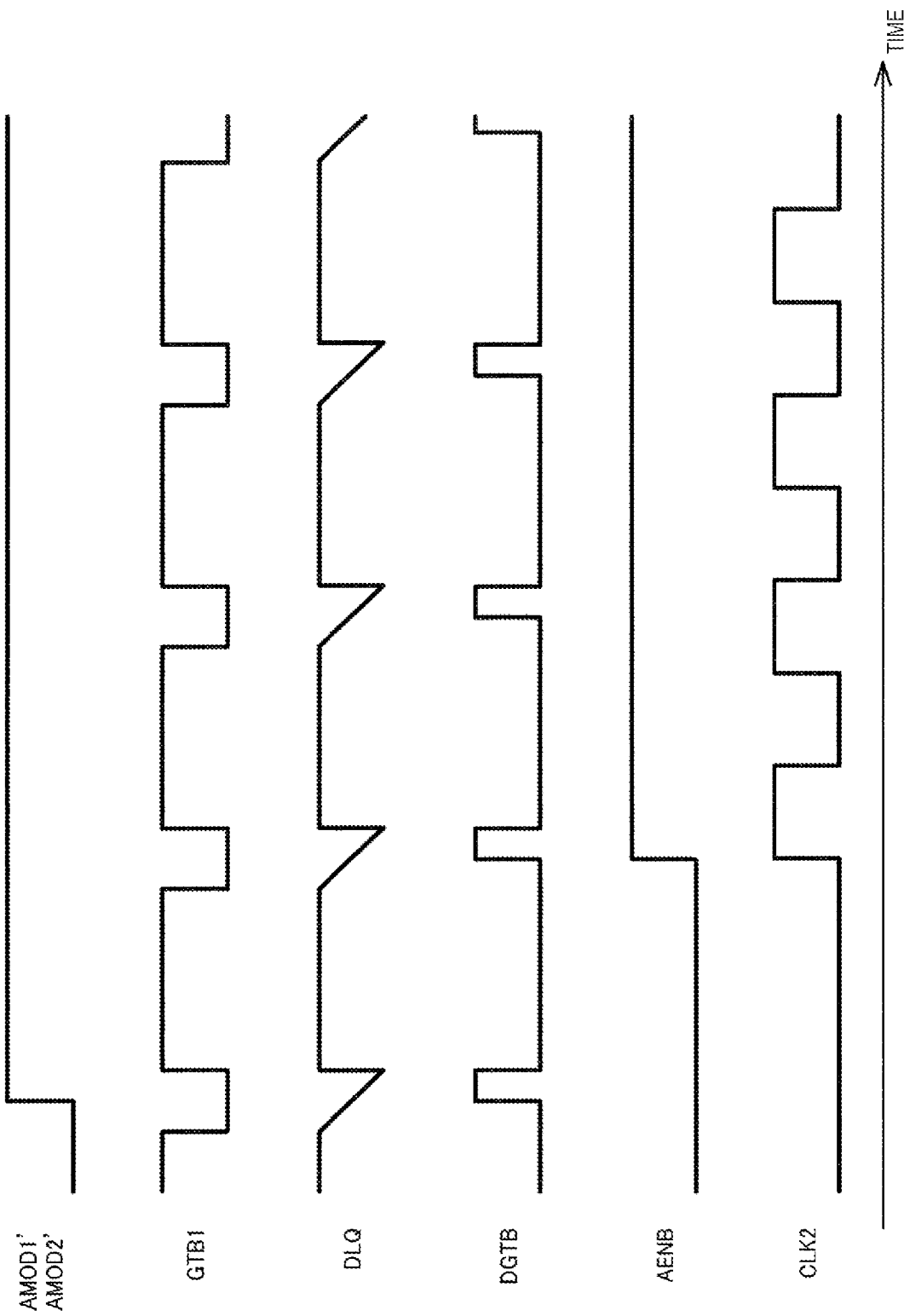
FIG. 13 is a waveform diagram for explaining an operation of the delay circuit.

An operation of the delay circuit 194 in FIG. 12 will be described with reference to FIG. 13. In FIG. 13, the high level is active and the low level is inactive.

When the second control signal GTB1 is at the high level, the inverter INE1 outputs the low level, so that the transistor TRE1 is turned on. Therefore, a voltage DLQ at one end of the capacitor CPE is a power source voltage VDA, and a charge of the capacitor CPE is in a reset state.

The resistor RE1 and the capacitor CE1 form a low-pass filter, and output the voltage VLP to the gate of the transistor TRE2 by smoothing the second control signal GTB1. The transistor TRE2 has an on-resistance corresponding to the voltage VLP, and allows a current to flow from one end of the capacitor CPE to the ground. In other words, when the second control signal GTB1 is at the low level, the charge of the capacitor CPE is increased and the voltage DLQ is decreased by the current flowing through the transistor TRE2. The voltage VLP is a voltage obtained by multiplying the voltage when GTB1 is at the high level by the duty of GTB1. That is, since the voltage VLP increases as the duty of GTB1 increases, the on-resistance of the transistor TRE2 decreases and a slope of the decrease in the voltage DLQ increases.

When the voltage DLQ falls equal to or less than a logical threshold of the inverter INE2, an output signal DGTB of the inverter INE2 changes from the low level to the high level. When the second control signal GTB1 is at the high level, the voltage DLQ becomes the power source voltage VDA again, so that the output signal DGTB of the inverter INE2 changes from the high level to the low level.

The output circuit QCE is a logic circuit, and after a logical product of AMOD1 and AMOD2 changes from the low level to the high level, the enable signal AENB changes from the low level to the high level at a first rising edge of DGTB. When the enable signal AENB changes from the low level to the high level, the second oscillation circuit 180 starts the oscillation and outputs the second clock signal CLK2. As described above, the second clock signal CLK2 of which a phase is delayed from the second control signal GTB1 is generated.

In the example of FIG. 13, the phase of 0 degrees of the second clock signal CLK2 is delayed from a falling edge of the second control signal GTB1. The delay time is CPE× VDA/ITRE2 when the current flowing through the transistor TRE2 is ITRE2.

4. Detailed Configuration Example of Mode Determination Circuit

Figure 14:
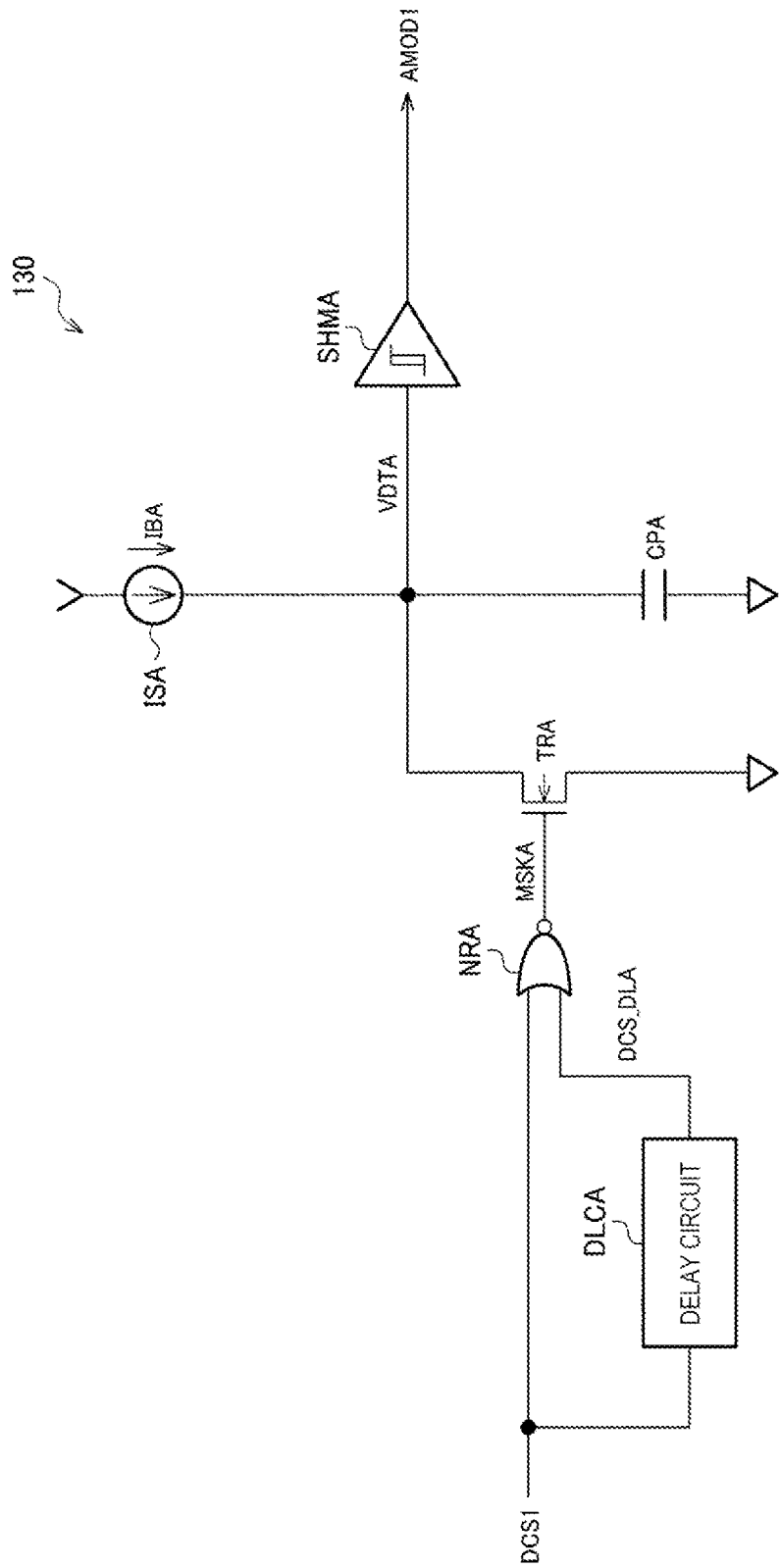
FIG. 14 is a detailed configuration example of a first mode determination circuit.

FIG. 14 is a detailed configuration example of the first mode determination circuit 130. The second mode determination circuit 170 has the same configuration.

The first mode determination circuit 130 includes a delay circuit DLCA, a NOR circuit NRA, a transistor TRA, a current source ISA, a capacitor CPA, and a buffer circuit SHMA.

One end of the capacitor CPA is coupled to the second power source node. The second power source node is, for example, a ground node. The current source ISA is coupled to the other end of the capacitor CPA and supplies a current IBA to the capacitor CPA. The transistor TRA is an N-type transistor and is coupled between the other end of the capacitor CPA and the second power source node. That is, the source of the transistor TRA is coupled to the second power source node, and the drain of the transistor TRA is coupled to the other end of the capacitor CA. The voltage at the other end of the capacitor CA is set to VDTA. The buffer circuit SHMA determines an output logic level based on the threshold voltage. That is, the buffer circuit SHMA outputs the first dimming mode determination signal AMOD1 of the first logic level or the second logic level depending on whether or not the voltage VDTA is higher than the threshold voltage. The buffer circuit SHMA is, for example, a Schmitt circuit.

Figure 15:
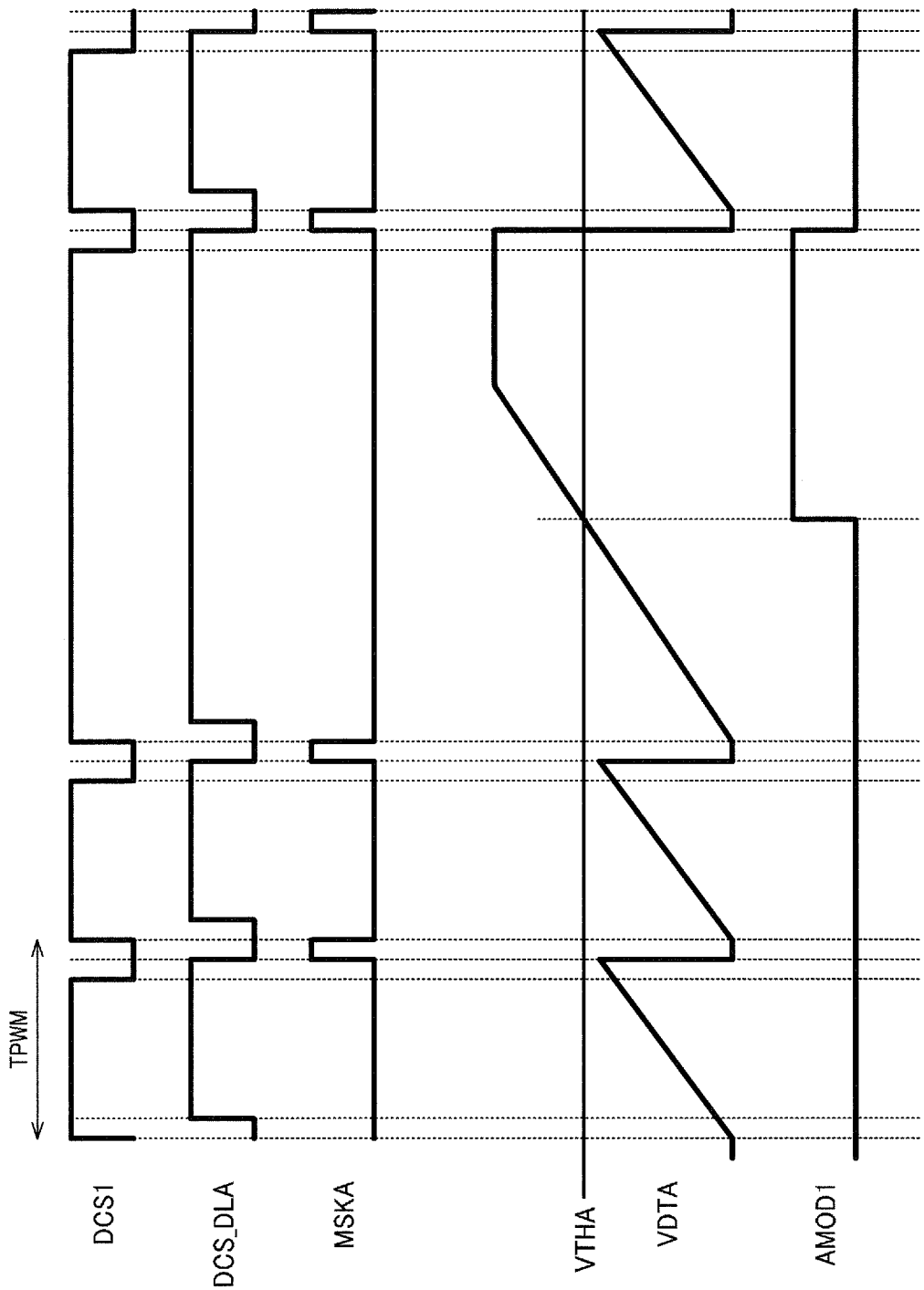
FIG. 15 is a waveform diagram for explaining an operation of the first mode determination circuit.

FIG. 15 is a waveform diagram for explaining an operation of the first mode determination circuit 130. In FIG. 15, the first logic level is set to the low level, the second logic level is set to the high level, and the second power source is set to the ground.

The delay circuit DLCA outputs a signal DCS DLA obtained by delaying the first PWM signal DCS1. The delay time is a time sufficiently shorter than the cycle TPWM of the first PWM signal DCS1. The NOR circuit NRA outputs a negative logical sum of the first PWM signal DCS1 and the signal DCS DLA as a mask signal MSKA. When the first PWM signal DCS1 is at the low level, the mask signal MSKA basically becomes the high level, but the rising of the mask signal MSKA is delayed by the delay time by the delay circuit DLCA.

When the mask signal MSKA is at the high level, the transistor TRA is turned on, so that the voltage VDTA at the other end of the capacitor CPA is the ground. When the mask signal MSKA is at the low level, the transistor TRA is turned off, and the current IBA is supplied to the capacitor CPA. Therefore, the voltage VDTA increases. In a case of the first PWM dimming mode, the mask signal MSKA is at the high level again, so that the voltage VDTA returns to the ground. In this case, a threshold voltage VTHA of the buffer circuit SHMA is set so as not to exceed a maximum value of the voltage VDTA. That is, in the first PWM dimming mode, the first dimming mode determination signal AMOD1 is maintained at the low level.

In a case of the first analog dimming mode, the first PWM signal DCS1 is at a high level for a period longer than the cycle TPWM. In this case, since the voltage VDTA exceeds the threshold voltage VTHA, the first dimming mode determination signal AMOD1 changes from the low level to the high level. When it becomes the first PWM dimming mode again and the first PWM signal DCS1 is at the low level, the mask signal MSKA becomes the high level, and the first dimming mode determination signal AMOD1 becomes the low level. As described above, the first analog dimming mode and the first PWM dimming mode are detected based on a length of the active period of the first PWM signal DCS1.

5. Projection-Type Video Display Apparatus

Figure 16:
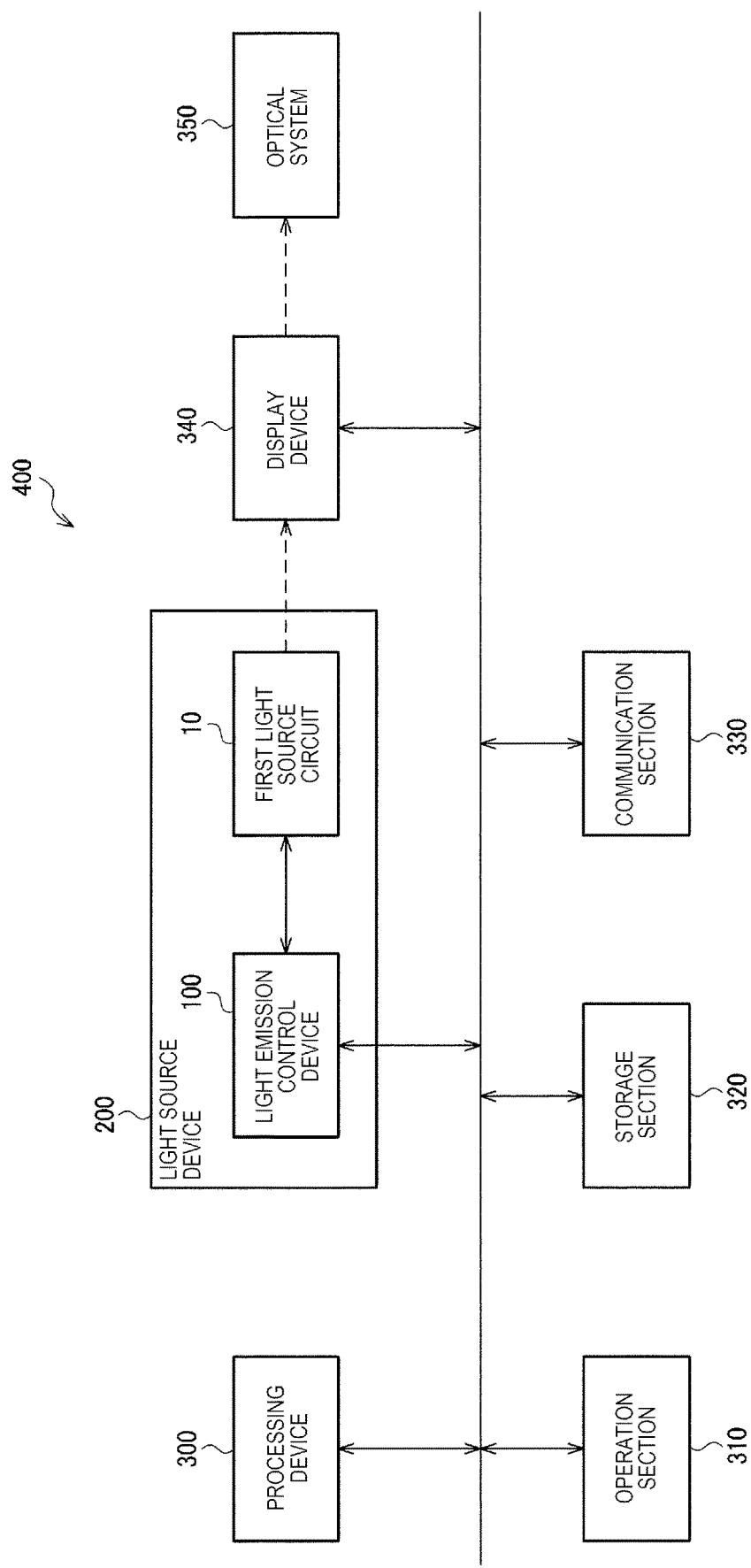
FIG. 16 is a configuration example of a projection-type video display apparatus.

FIG. 16 is a configuration example of a projection-type video display apparatus 400 including the light source device 200. The projection-type video display apparatus 400 is an apparatus that projects a video on a screen, and is also called a projector. The projection-type video display apparatus 400 includes the light source device 200, a processing device 300, an operation section 310, a storage section 320, a communication section 330, a display device 340, and an optical system 350. The light source device 200 includes the light emission control device 100 and the first light source circuit 10.

The communication section 330 performs communication with an information processing device such as a PC. The communication section 330 is various video interfaces such as a VGA standard, a DVI standard, and an HDMI (HDMI is a registered trademark) standard. Alternatively, the communication section 330 may be a communication interface such as a USB standard or a network interface such as a LAN. The storage section 320 stores the image data input from the communication section 330. The storage section 320 may function as a working memory for the processing device 300. The storage section 320 is various storage devices such as a semiconductor memory or a hard disk drive. The operation section 310 is a user interface for the user to operate the projection-type video display apparatus 400. For example, the operation section 310 is a button, a touch panel, a pointing device, a character input device, or the like. The processing device 300 is a processor such as a CPU or a MPU. The processing device 300 transmits the image data stored in the storage section 320 to the display device 340. In addition, the processing device 300 performs dimming control by outputting a PWM signal and a dimming voltage to the light emission control device 100. The display device 340 includes a liquid crystal display panel and a display driver that displays an image on the liquid crystal display panel based on the image data. Light enters the liquid crystal panel from the first light source circuit 10, and the light transmitted through the liquid crystal panel is projected onto a screen by the optical system 350. In FIG. 16, a light path is indicated by dotted arrows.

The light emission control device of the present embodiment described above controls the first switching element, the second switching element, the third switching element, and the fourth switching element. The first switching element is provided in series with the first light emission element between the first power source node and one end of the first inductor. The second switching element is provided between the other end of the first inductor and the second power source node. The third switching element is provided in series with the second light emission element between the first power source node and one end of the second inductor. The fourth switching element is provided between the other end of the second inductor and the second power source node. The light emission control device includes the first light emission control circuit and the second light emission control circuit. The first light emission control circuit outputs the first control signal for controlling turning on/off of the first switching element based on the first PWM signal, and the second control signal for controlling turning on/off of the second switching element in a period in which the first PWM signal is active. The second light emission control circuit outputs the third switching element for controlling turning on/off of the third switching element based on the second PWM signal, and the fourth control signal for controlling turning on/off of the fourth switching element in the period in which the second PWM signal is active. In the first PWM dimming mode in which the light emission amount of the first light emission element is set by the on-duty of the first PWM signal, the first light emission control circuit controls the phase of the second control signal based on the first PWM signal. In the second PWM dimming mode in which the light emission amount of the second light emission element is set by the on-duty of the second PWM signal, the second light emission control circuit controls the phase of the fourth control signal based on the second PWM signal. In the first analog dimming mode in which the first PWM signal is fixed to be active and in the second analog dimming mode in which the second PWM signal is fixed to be active, the second light emission control circuit outputs the fourth control signal of which the phase is different from that of the second control signal.

In this way, in the first PWM dimming mode, when the first PWM signal is active, the switching of the second switching element is restarted, and the phase of the second control signal at the time of the restart is controlled based on the first PWM signal. Further, in the second PWM dimming mode, when the second PWM signal is active, the switching of the fourth switching element is restarted, and the phase of the fourth control signal at the time of the restart is controlled based on the second PWM signal. This makes it possible to ensure the on period when the switching of the switching element is restarted, so that sufficient energy is accumulated in the inductor and a sufficient current can flow through the light emission element. Further, in the first analog dimming mode and the second analog dimming mode, the second control signal and the fourth control signal are different in phase, so that the second switching element and the fourth switching element are turned on and off at different phases. Therefore, the timing at which the current flowing through the first light emission element is maximized is shifted from the timing at which the current flowing through the second light emission element is maximized, so that the load of the power source circuit for supplying power to the first light source circuit and the second light source circuit can be reduced.

In the present embodiment, the light emission control device includes the first oscillation circuit that generates the first clock signal, the second oscillation circuit that generates the second clock signal, and the clock phase shift circuit that outputs the third clock signal in which the phase of the first clock signal is shifted. The first light emission control circuit may output the second control signal based on the first clock signal. The second light emission control circuit may output the fourth control signal based on the second clock signal in the second PWM dimming mode, and may output the fourth control signal based on the third clock signal in the first analog dimming mode and the second analog dimming mode.

In this way, in the first analog dimming mode and the second analog dimming mode, the second control signal is output based on the first clock signal, and the fourth control signal is output based on the third clock signal in which the phase of the first clock signal is shifted. Therefore, in the first analog dimming mode and the second analog dimming mode, the second switching element and the fourth switching element can be switched at different phases.

In the present embodiment, the clock phase shift circuit may output the third clock signal obtained by inverting the phase of the first clock signal.

In this way, in the first analog dimming mode and the second analog dimming mode, the fourth control signal is output based on the third clock signal in which the phase of the first clock signal is inverted. Therefore, in the first analog dimming mode and the second analog dimming mode, the second switching element and the fourth switching element can be switched in opposite phases.

In the present embodiment, the light emission control device includes the first oscillation circuit that generates the first clock signal, the second oscillation circuit that generates the second clock signal, and the delay circuit that outputs the enable signal of the second oscillation circuit based on a signal obtained by delaying the second control signal. The first light emission control circuit may output the second control signal based on the first clock signal. The second oscillation circuit may start the oscillation based on the second PWM signal in the second PWM dimming mode, and may start the oscillation based on the enable signal in the first analog dimming mode and the second analog dimming mode. The second light emission control circuit may output the fourth control signal based on the second clock signal.

In this way, in the first analog dimming mode and the second analog dimming mode, the oscillation of the second oscillation circuit is started based on the enable signal output based on the signal obtained by delaying the second control signal. Since the fourth control signal is output based on the second clock signal output from the second oscillation circuit, the phases of the second control signal and the fourth control signal can be made different.

In the present embodiment, the delay circuit may delay the second control signal by the delay amount corresponding to the period in which the second control signal is active or the time controlled by the duty, and may output the enable signal based on the delayed second control signal.

In this way, in the first analog dimming mode and the second analog dimming mode, the oscillation start of the second oscillation circuit can be delayed by the delay amount corresponding to the period in which the second control signal is active or the time controlled by the duty. Therefore, the phase of the second control signal and the fourth control signal can be made different by the delay amount.

In the present embodiment, the first oscillation circuit may start the oscillation at the active edge of the first PWM signal in the first PWM dimming mode. The second oscillation circuit may start the oscillation at the active edge of the second PWM signal in the second PWM dimming mode.

In this way, in the first PWM dimming mode, the phase of the first clock signal at the active edge of the first PWM signal is the same at each active edge. In the second PWM dimming mode, the phase of the second clock signal at the active edge of the second PWM signal is the same at each active edge. Therefore, it is possible to secure the on period when the switching of the second switching element is restarted and the on period when the switching of the fourth switching element is restarted.

In the present embodiment, the light emission control device includes the first mode determination circuit and the second mode determination circuit. The first mode determination circuit may determine whether the first light emission control circuit is in the first PWM dimming mode or the first analog dimming mode based on the first PWM signal. The second mode determination circuit may determine whether the second light emission control circuit is in the second PWM dimming mode or the second analog dimming mode based on the second PWM signal.

The duty ratio of the PWM signal differs between the PWM dimming mode and the analog dimming mode. Therefore, it is possible to determine the dimming mode of the first light emission control circuit based on the first PWM signal. Further, it is possible to determine the dimming mode of the second light emission control circuit based on the second PWM signal.

In the present embodiment, the first mode determination circuit may determine whether the first light emission control circuit is in the first PWM dimming mode or the first analog dimming mode by determining the length of the active period of the first PWM signal or the duty ratio of the first PWM signal. The second mode determination circuit may determine whether the second light emission control circuit is in the second PWM dimming mode or the second analog dimming mode by determining the length of the active period of the second PWM signal or the duty ratio of the second PWM signal.

In this way, it is possible to determine the dimming mode by determining the length of the active period of the PWM signal or the duty ratio of the PWM signal. Since the ratio of the length of the active period to the cycle of the PWM signal is the duty ratio, it is possible to substantially determine the duty ratio by determining the length of the active period.

The light source device of the present embodiment includes any one of the light emission control devices described above, the first light emission element, the first switching element, the second switching element, the first inductor, the second light emission element, the third switching element, the fourth switching element, and the second inductor.

The projection-type video display apparatus according to the present embodiment includes any of the light source devices described above.

Although the present embodiments have been described in detail above, it will be easily understood by those skilled in the art that many modified examples can be made without departing from the novel matters and effects of the present disclosure. Accordingly, all such modified examples are intended to be included within the scope of the present disclosure. For example, a term described at least once together with a different term having a broader meaning or the same meaning in the specification or the drawings can be replaced with a different term anywhere in the specification or the drawings. All combinations of the present embodiment and the modified examples are also included in the scope of the present disclosure. Further, the configurations and operations of the light emission control circuit, the light emission control device, the light source circuit, the light source device, and the projection-type video display apparatus are not limited to those described in the present embodiments, and various modifications can be made.

What is claimed is:

1. A light emission control device for controlling a first switching element provided in series with a first light emission element between a first power source node and one end of a first inductor, a second switching element provided between the other end of the first inductor and a second power source node, a third switching element provided in series with a second light emission element between the first power source node and one end of a second inductor, and a fourth switching element provided between the other end of the second inductor and the second power source node, the light emission control device comprising:
a first light emission control circuit outputting a first control signal for controlling turning on/off of the first switching element based on a first PWM signal and a second control signal for controlling turning on/off of the second switching element in a period in which the first PWM signal is active; and
a second light emission control circuit outputting a third control signal for controlling turning on/off of the third switching element based on a second PWM signal and a fourth control signal for controlling turning on/off of the fourth switching element in a period in which the second PWM signal is active, wherein
in a first PWM dimming mode in which a light emission amount of the first light emission element is set by an on-duty of the first PWM signal, the first light emission control circuit controls a phase of the second control signal based on the first PWM signal,
in a second PWM dimming mode in which a light emission amount of the second light emission element is set by an on-duty of the second PWM signal, the second light emission control circuit controls a phase of the fourth control signal based on the second PWM signal, and
in a first analog dimming mode in which the first PWM signal is fixed to be active, and a second analog dimming mode in which the second PWM signal is fixed to be active, the second light emission control circuit outputs the fourth control signal having a phase different from that of the second control signal.

2. The light emission control device according to claim 1, further comprising:
a first oscillation circuit generating a first clock signal;
a second oscillation circuit generating a second clock signal; and
a clock phase shift circuit outputting a third clock signal in which a phase of the first clock signal is shifted, wherein
the first light emission control circuit outputs the second control signal based on the first clock signal, and
the second light emission control circuit outputs the fourth control signal based on the second clock signal in the second PWM dimming mode, and outputs the fourth control signal based on the third clock signal in the first analog dimming mode and the second analog dimming mode.

3. The light emission control device according to claim 2, wherein
the clock phase shift circuit outputs the third clock signal obtained by inverting the phase of the first clock signal.

4. The light emission control device according to claim 1, further comprising:
a first oscillation circuit generating a first clock signal;
a second oscillation circuit generating a second clock signal; and
a delay circuit outputting an enable signal of the second oscillation circuit based on a signal obtained by delaying the second control signal, wherein
the first light emission control circuit outputs the second control signal based on the first clock signal,
the second oscillation circuit starts oscillation based on the second PWM signal in the second PWM dimming mode, and starts oscillation based on the enable signal in the first analog dimming mode and the second analog dimming mode, and
the second light emission control circuit outputs the fourth control signal based on the second clock signal.

5. The light emission control device according to claim 4, wherein
the delay circuit delays the second control signal by a delay amount corresponding to a period in which the second control signal is active or a time controlled by a duty, and outputs the enable signal based on the delayed second control signal.

6. The light emission control device according to claim 2, wherein
the first oscillation circuit starts oscillation at an active edge of the first PWM signal in the first PWM dimming mode, and
the second oscillation circuit starts oscillation at an active edge of the second PWM signal in the second PWM dimming mode.

7. The light emission control device according to claim 1, further comprising:
a first mode determination circuit determining whether the first light emission control circuit is in the first PWM dimming mode or the first analog dimming mode based on the first PWM signal; and a second mode determination circuit determining whether the second light emission control circuit is in the second PWM dimming mode or the second analog dimming mode based on the second PWM signal.

8. The light emission control device according to claim 7, wherein the first mode determination circuit determines whether the first light emission control circuit is in the first PWM dimming mode or the first analog dimming mode by determining a length of an active period of the first PWM signal or a duty ratio of the first PWM signal, and the second mode determination circuit determines whether the second light emission control circuit is in the second PWM dimming mode or the second analog dimming mode by determining a length of an active period of the second PWM signal or a duty ratio of the second PWM signal.

9. A light source device comprising:
the light emission control device according to claim 1;
the first light emission element;
the first switching element;
the second switching element;
the first inductor;
the second light emission element;
the third switching element;
the fourth switching element; and
the second inductor.

10. A projection-type video display apparatus comprising:
the light source device according to claim 9.

* * * * *